United States Patent
Yajima et al.

(10) Patent No.: US 9,419,601 B2
(45) Date of Patent: Aug. 16, 2016

(54) INPUT PROTECTION CIRCUIT, ELECTRONIC DEVICE, ELECTRONIC APPARATUS, AND MOVING OBJECT

(71) Applicant: Seiko Epson Corporation, Tokyo (JP)

(72) Inventors: Hidehiko Yajima, Suwa (JP); Satoru Kodaira, Chino (JP)

(73) Assignee: Seiko Epson Corporation (JP)

( * ) Notice: Subject to any disclaimer, the term of this patent is extended or adjusted under 35 U.S.C. 154(b) by 70 days.

(21) Appl. No.: 14/454,074

(22) Filed: Aug. 7, 2014

(65) Prior Publication Data

US 2015/0043118 A1     Feb. 12, 2015

(30) Foreign Application Priority Data

Aug. 8, 2013  (JP) ................... 2013-164905

(51) Int. Cl.
  *H03K 17/08*  (2006.01)
  *H03K 17/0812*  (2006.01)
(52) U.S. Cl.
  CPC ................ *H03K 17/08122* (2013.01)
(58) Field of Classification Search
  CPC ............ H03K 17/08; H03K 17/08104; H03K 17/08122
  USPC ......................... 327/318–320, 333
  See application file for complete search history.

(56) References Cited

U.S. PATENT DOCUMENTS

| | | | | |
|---|---|---|---|---|
| 5,905,621 A | * | 5/1999 | Drapkin | H03K 19/00315 361/111 |
| 6,362,653 B1 | * | 3/2002 | Coughlin, Jr. | H03K 19/00315 326/57 |
| 7,501,852 B2 | | 3/2009 | Suzuki et al. | |
| 2004/0190209 A1 | * | 9/2004 | Jozwiak | H01L 27/0292 361/56 |

FOREIGN PATENT DOCUMENTS

| | | |
|---|---|---|
| JP | 08-008707 | 1/1996 |
| JP | 08-274543 | 10/1996 |
| JP | 2006-279569 | 10/2006 |

* cited by examiner

*Primary Examiner* — Kenneth B Wells
(74) *Attorney, Agent, or Firm* — Harness, Dickey & Pierce, P.L.C.

(57) ABSTRACT

An input protection circuit changes the voltage of a signal to be input to an input circuit to a predetermined voltage or less and outputs the signal. The input protection circuit includes a first NMOS transistor and a second NMOS transistor. The first NMOS transistor includes a source to which an input signal is input, a gate to which a voltage based on a first voltage is applied, and a drain that outputs the signal to the input circuit based on the input signal and the gate voltage. The second NMOS transistor includes a source and a gate to each of which the voltage based on the first voltage is applied, and a drain that outputs a second voltage to the input circuit.

8 Claims, 6 Drawing Sheets

INPUT PROTECTION CIRCUIT, ELECTRONIC DEVICE, ELECTRONIC APPARATUS, AND MOVING OBJECT

BACKGROUND

1. Technical Field

The present invention relates to an input protection circuit, an electronic device, an electronic apparatus, a moving object, and the like.

2. Related Art

An input protection circuit that limits the voltage of a signal to be input to an input circuit has been proposed for suppressing the deterioration of the elements in the input circuit. The input protection circuit is especially useful when the input signal has a voltage that is higher than the operating voltage of the input circuit.

JP-A-8-008707 discloses an input protection circuit in which the back gate voltage of a protecting MOS transistor is controlled to thereby reduce the threshold voltage and thus the output voltage of the protecting MOS transistor can be close to a power supply voltage VDD.

In the input protection circuit disclosed in JP-A-8-008707, the voltage of a signal to be input to an input circuit can be limited. However, when the input protection circuit is used with an input circuit (for example, an inverter circuit composed of a PMOS and an NMOS) that performs an operation depending on the voltage of the input signal with the power supply voltage VDD being a reference voltage, the signal to be input to the input circuit is less than the reference voltage in some cases, and therefore, the switching operation of the input circuit can be unstable in some cases.

SUMMARY

An advantage of some aspects of the invention is to provide an input protection circuit that can protect an input circuit and stabilize the operation of the input circuit, an electronic device, an electronic apparatus, and a moving object.

APPLICATION EXAMPLE 1

This application example is directed to an input protection circuit that changes the voltage of a signal to be input to an input circuit to a predetermined voltage or less and outputs the signal, including: a first NMOS transistor including a source to which an input signal is input, a gate to which a voltage based on a first voltage is applied, and a drain that outputs the signal to the input circuit based on the input signal and the gate voltage; and a second NMOS transistor including a drain and a gate to each of which the voltage based on the first voltage is applied, and a source that outputs a second voltage to the input circuit.

According to this application example, when the input protection circuit is used together with an input circuit (for example, an inverter circuit composed of a PMOS transistor and an NMOS transistor) that performs an operation depending on the voltage of the input signal with the second voltage being a reference voltage, the signal to be input to the input circuit is less than the voltage based on the first voltage, and also the second voltage serving as the reference voltage of the operation of the input circuit is less than the voltage based on the first voltage. The signal to be input to the input circuit is less than the voltage based on the first voltage, whereby the input circuit can be protected. Moreover, the second voltage serving as the reference voltage of the operation of the input circuit is less than the voltage based on the first voltage, whereby the operation of the input circuit can be stabilized.

APPLICATION EXAMPLE 2

In the input protection circuit according to the application example described above, it is preferable that a back gate of the first NMOS transistor and a back gate of the second NMOS transistor are at a substrate potential.

According to this application example, since a special configuration (for example, an NMOS transistor having a triple-well structure) for controlling a back gate voltage is unnecessary, it is possible to realize the input protection circuit that can be manufactured at low cost compared to the configuration of controlling the back gate voltage. Moreover, due to a substrate bias effect, the smaller the difference between the source voltage and the back gate voltage of the second NMOS transistor is, the lower the threshold voltage of the second NMOS transistor is; while the greater the difference between the source voltage and the back gate voltage of the second NMOS transistor is, the higher the threshold voltage of the second NMOS transistor is. On the other hand, if the voltage is stepped down by a resistor instead of the second NMOS transistor, the step-down width is in the same range irrespective of the magnitude of the voltage based on the first voltage. According to the application example, especially when the voltage based on the first voltage is low, the maximum voltage of the signal to be input to the input circuit can be close to the voltage based on the first voltage compared to the case where the voltage is stepped down by a resistor instead of the second NMOS transistor. Hence, especially when the voltage based on the first voltage is low, a voltage width that can be used as the signal to be input to the input circuit can be widened. Moreover, according to the application example, especially when the voltage based on the first voltage is high, the second voltage can be more reliably less than the voltage based on the first voltage. Therefore, the operation of the input circuit can be stabilized.

APPLICATION EXAMPLE 3 and APPLICATION EXAMPLE 4

In the input protection circuit according to the application example described above, it is preferable that the input protection circuit further includes a power supply terminal to which the first voltage is applied, and a diode, that the diode is connected between the drain of the first NMOS transistor and the power supply terminal, that a cathode of the diode is connected to the power supply terminal side, and that an anode of the diode is connected to the drain side of the first NMOS transistor.

When a leakage current occurs in the first NMOS transistor, the drain potential of the first NMOS transistor may rise unintendedly. According to these application examples, when the drain potential of the first NMOS transistor rises, the rise of the drain potential of the first NMOS transistor can be suppressed by a current flowing into the power supply terminal via the diode.

APPLICATION EXAMPLE 5

In the input protection circuit according to the application example described above, it is preferable that the first NMOS transistor and the second NMOS transistor are depletion type transistors.

The depletion type transistor has a low threshold voltage compared to an enhancement type transistor. Hence, with the use of the depletion type transistors as the first NMOS transistor and the second NMOS transistor, the maximum voltage of the signal to be input to the input circuit can be close to the voltage based on the first voltage compared to the case where the enhancement type transistors are used as the first NMOS transistor and the second NMOS transistor. Hence, the voltage width that can be used as the signal to be input to the input circuit can be widened.

APPLICATION EXAMPLE 6

In the input protection circuit according to the application example described above, it is preferable that the threshold voltage of the second NMOS transistor is higher than the threshold voltage of the first NMOS transistor.

With this configuration, the high-level voltage of the signal to be input to the input circuit is higher than the second voltage serving as the reference voltage of the operation of the input circuit. Hence, the operation of the input circuit can be stabilized.

APPLICATION EXAMPLE 7

This application example is directed to an input protection circuit including: a first step-down unit that receives inputs of a voltage based on a first voltage and an input signal, and outputs, based on the voltage based on the first voltage and the input signal, a signal having a voltage lower than the first voltage; and a second step-down unit that receives an input of the voltage based on the first voltage, and outputs a second voltage lower than the voltage based on the first voltage.

According to this application example, when the input protection circuit is used together with an input circuit (for example, an inverter circuit composed of a PMOS transistor and an NMOS transistor) that performs an operation depending on the voltage of the input signal with the second voltage being a reference voltage, the signal (signal output by the first step-down unit) to be input to the input circuit is less than the voltage based on the first voltage, and also the second voltage serving as the reference voltage of the operation of the input circuit is less than the voltage based on the first voltage. The signal to be input to the input circuit is less than the voltage based on the first voltage, whereby the input circuit can be protected. Moreover, the second voltage serving as the reference voltage of the operation of the input circuit is less than the voltage based on the first voltage, whereby the operation of the input circuit can be stabilized.

APPLICATION EXAMPLE 8 and APPLICATION EXAMPLE 9

These application examples are directed to an electronic device including any of the input protection circuits described above and the input circuit described above, wherein the input circuit includes a PMOS transistor, the signal output from the drain of the first NMOS transistor is input to a gate of the PMOS transistor, and the second voltage output from the drain of the second NMOS transistor is input to a source of the PMOS transistor.

According to these application examples, since the second voltage is less than the voltage based on the first voltage, the switching operation of the PMOS transistor can be stabilized compared to the case where the voltage based on the first voltage is input to the source of the PMOS transistor.

APPLICATION EXAMPLE 10

This application example is directed to an electronic apparatus including any of the input protection circuits described above, or the electronic device described above.

APPLICATION EXAMPLE 11

This application example is directed to a moving object including any of the input protection circuits described above, or the electronic device described above.

According to the electronic apparatus and the moving object according to these application examples, since the input protection circuit or the electronic device that can protect the input circuit and stabilize the operation of the input circuit is included, it is possible to realize the electronic apparatus and the moving object each with high operational reliability.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The drawings referred to herein are for convenience of description only. The embodiments described below do not unduly limit the scope of the invention as set forth in the appended claims. Moreover, not all of the configurations described below are indispensable constituent features of the invention.

1. Input Protection Circuit

Figure 1:
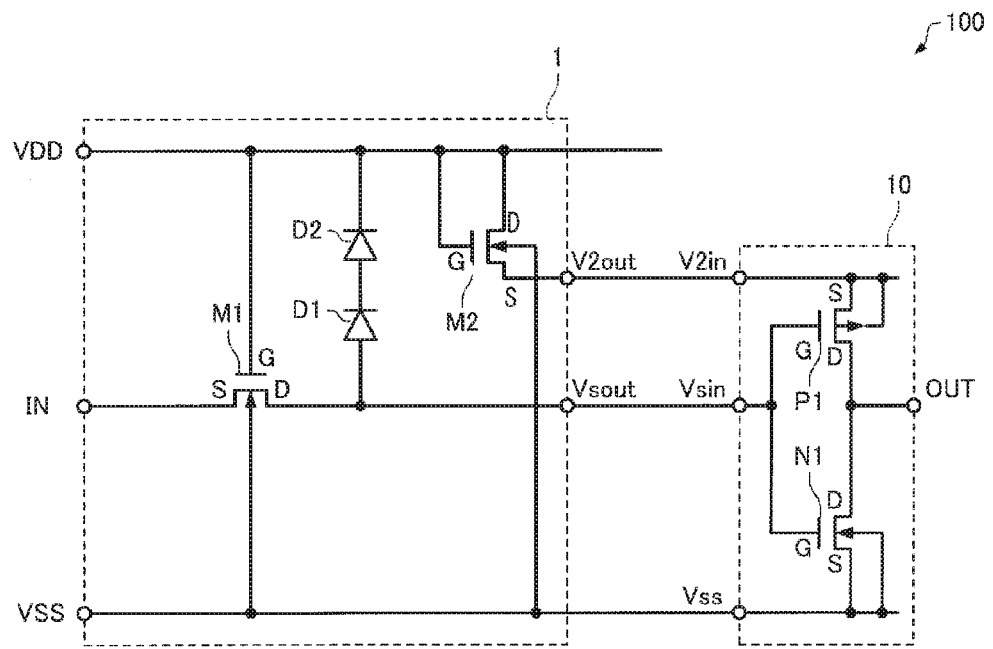
FIG. 1 is a circuit diagram showing the configurations of an input protection circuit and an electronic device according to an embodiment.

FIG. 1 is a circuit diagram showing the configurations of an input protection circuit 1 and an electronic device 100 according to this embodiment.

The input protection circuit 1 according to the embodiment is configured to include a first step-down unit and a second step-down unit. The first step-down unit receives inputs of a voltage based on a first voltage V1 and an input signal, and outputs, based on the voltage based on the first voltage V1 and the input signal, a signal having a voltage lower than the first voltage V1. The second step-down unit receives an input of the voltage based on the first voltage V1, and outputs a second voltage V2 lower than the voltage based on the first voltage V1.

More specifically, the input protection circuit 1 according to the embodiment is the input protection circuit 1 that outputs a signal to an input circuit 10. The input protection circuit 1 is configured to include a first NMOS transistor M1 and a second NMOS transistor M2. The first NMOS transistor M1 includes a source to which an input signal is input, a gate to which the voltage based on the first voltage V1 is applied, and a drain that outputs, based on the input signal and the gate voltage, the signal to the input circuit 10. The second NMOS transistor M2 includes a source and a gate to each of which the voltage based on the first voltage V1 is applied, and a drain that outputs the second voltage V2 to the input circuit 10. The function of the first step-down unit is realized mainly by the first NMOS transistor M1. The function of the second step-down unit is realized mainly by the second NMOS transistor M2.

In the example shown in FIG. 1, the input protection circuit 1 is configured to include a power supply terminal VDD to which the first voltage V1 is applied, an input terminal IN to which an input signal is supplied, a ground potential terminal VSS to which a ground potential is applied, a second voltage output terminal V2out that outputs the second voltage V2, and a signal output terminal Vsout that outputs the signal to the input circuit 10.

The source of the first NMOS transistor M1 is connected to the input terminal IN. The input signal is supplied via the input terminal IN to the source of the first NMOS transistor M1.

The gate of the first NMOS transistor M1 is connected to the power supply terminal VDD. The gate of the first NMOS transistor M1 may be connected via a passive element such as a resistor to the power supply terminal VDD. A voltage based on the first voltage V1 applied to the power supply terminal VDD is applied to the gate of the first NMOS transistor M1. The "voltage based on the first voltage V1" may be the first voltage V1 itself, or may be a voltage stepped down from the first voltage V1 via a resistor.

The drain of the first NMOS transistor M1 is connected to the signal output terminal Vsout. A signal based on the input signal and the gate voltage is output from the drain of the first NMOS transistor M1. More specifically, when the voltage of the input signal is lower than Vg1-Vth1 where Vg1 is the gate voltage of the first NMOS transistor M1 and Vth1 is the threshold voltage of the first NMOS transistor M1, the signal output from the drain of the first NMOS transistor M1 is a voltage signal depending on the voltage of the input signal. When the voltage of the input signal is equal to or higher than Vg1-Vth1, the signal output from the drain of the first NMOS transistor M1 is a voltage signal of Vg1-Vth1.

The drain and the gate of the second NMOS transistor M2 are connected to the power supply terminal VDD. The drain and the gate of the second NMOS transistor M2 may be connected via a passive element such as a resistor to the power supply terminal VDD. The voltage based on the first voltage V1 applied to the power supply terminal VDD is applied to the drain and the gate of the second NMOS transistor M2.

The source of the second NMOS transistor M2 is connected to the second voltage output terminal V2out. The second voltage V2 is output from the source of the second NMOS transistor M2. More specifically, the second voltage V2 is a voltage of Vg2 - Vth2 where Vg2 is the gate voltage of the second NMOS transistor M2 and Vth2 is the threshold voltage of the second NMOS transistor M2.

The input circuit 10 is configured to include a second voltage input terminal V2in to which the second voltage V2 is input, a signal input terminal Vsin to which the signal output from the signal output terminal Vsout of the input protection circuit 1 is input, a ground potential terminal Vss to which the ground potential is applied, and an output terminal OUT from which a signal output by the input circuit 10 is output.

In the example shown in FIG. 1, the input circuit 10 is composed of an inverter circuit. More specifically, the input circuit 10 is configured to include a PMOS transistor P1 and an NMOS transistor N1. A gate of the PMOS transistor P1 and a gate of the NMOS transistor N1 are connected to the signal input terminal Vsin. A drain of the PMOS transistor P1 and a drain of the NMOS transistor N1 are connected to the output terminal OUT. A source and a back gate of the PMOS transistor P1 are connected to the second voltage input terminal V2in. A source and a back gate of the NMOS transistor N1 are connected to the ground potential terminal Vss.

According to the input protection circuit according to the embodiment, when the input protection circuit is used together with the input circuit 10 (for example, an inverter circuit composed of a PMOS transistor and an NMOS transistor) that performs an operation depending on the voltage of an input signal with the second voltage V2 being a reference voltage, the voltage of the signal (signal output by the first step-down unit; a signal output from the drain of the first NMOS transistor M1) to be input to the input circuit 10 is less than the voltage based on the first voltage V1, and also the second voltage V2 serving as the reference voltage of the operation of the input circuit 10 is less than the voltage based on the first voltage V1. The voltage of the signal to be input to the input circuit 10 is less than the voltage based on the first voltage V1, whereby the input circuit 10 can be protected. Moreover, the second voltage V2 serving as the reference voltage of the operation of the input circuit 10 is less than the voltage based on the first voltage V1, whereby the operation of the input circuit 10 can be stabilized.

In the input protection circuit 1 according to the embodiment, a back gate of the first NMOS transistor M1 and a back gate of the second NMOS transistor M2 may be at a substrate potential. In general, the substrate potential of a semiconductor integrated circuit is the ground potential. In the example shown in FIG. 1, the back gate of the first NMOS transistor M1 and the back gate of the second NMOS transistor M2 are connected to the ground potential terminal VSS.

According to the input protection circuit 1 according to the embodiment, since a special configuration (for example, an NMOS transistor having a triple-well structure) for controlling a back gate voltage is unnecessary, it is possible to realize the input protection circuit 1 that can be manufactured at low cost compared to the configuration of controlling the back gate voltage. Moreover, due to a substrate bias effect, the smaller the difference between a source voltage Vs2 and a back gate voltage Vb2 of the second NMOS transistor M2 is, the lower the threshold voltage Vth2 of the second NMOS transistor M2 is; while the greater the difference between the source voltage Vs2 and the back gate voltage Vb2 of the second NMOS transistor M2 is, the higher the threshold voltage Vth2 of the second NMOS transistor M2 is. On the other hand, if the voltage is stepped down by a resistor instead of the second NMOS transistor M2, the step-down width is in the same range irrespective of the magnitude of the voltage based on the first voltage. According to the input protection circuit 1 according to the embodiment, especially when the voltage based on the first voltage V1 is low, the maximum voltage of the signal to be input to the input circuit 10 can be close to the voltage based on the first voltage V1 compared to the case where the voltage is stepped down by a resistor instead of the second NMOS transistor M2. Hence, especially when the voltage based on the first voltage V1 is low, a voltage width that can be used as the signal to be input to the input circuit 10 can be widened. Moreover, according to the input protection circuit 1 according to the embodiment, especially when the voltage based on the first voltage V1 is high, the second voltage V2 can be more reliably less than the voltage based on the first voltage V1. Therefore, the operation of the input circuit 10 can be stabilized.

In the input protection circuit 1 according to the embodiment, the power supply terminal VDD to which the first voltage V1 is applied, and a diode D1 may be included, the diode D1 may be connected between the drain of the first NMOS transistor M1 and the power supply terminal VDD, a cathode of the diode D1 may be arranged on the power supply terminal VDD side, and an anode of the diode D1 may be arranged on the drain side of the first NMOS transistor M1. The diode D1 may be connected via at least one of another diode and a passive element to the drain of the first NMOS transistor M1. Moreover, the diode D1 may be connected via at least one of another diode and a passive element to the power supply terminal VDD. In the example shown in FIG. 1, the cathode of the diode D1 is connected via a diode D2 to the power supply terminal VDD. More specifically, the cathode of the diode D1 is connected to an anode of the diode D2, and a cathode of the diode D2 is connected to the power supply terminal VDD.

If a leakage current occurs in the first NMOS transistor M1, the drain potential of the first NMOS transistor M1 may rise unintendedly. According to the input protection circuit 1 according to the embodiment, when the drain potential of the first NMOS transistor M1 rises, the rise of the drain potential of the first NMOS transistor M1 can be suppressed by a current flowing into the power supply terminal VDD via the diode D1.

In the input protection circuit 1 according to the embodiment, the first NMOS transistor M1 and the second NMOS transistor M2 may be depletion type transistors (depletion transistors).

The depletion type transistor has a low threshold voltage compared to an enhancement type transistor. Hence, with the use of the depletion type transistors as the first NMOS transistor M1 and the second NMOS transistor M2, the maximum voltage of the signal to be input to the input circuit 10 can be close to the voltage based on the first voltage V1 compared to the case where the enhancement type transistors are used as the first NMOS transistor M1 and the second NMOS transistor M2. Hence, the voltage width that can be used as the signal to be input to the input circuit 10 can be widened.

In the input protection circuit 1 according to the embodiment, the threshold voltage Vth2 of the second NMOS transistor M2 may be higher than the threshold voltage Vth1 of the first NMOS transistor M1. For example, the first NMOS transistor M1 may be composed of the depletion type transistor, while the second NMOS transistor M2 may be composed of the enhancement type transistor.

As described above, when the voltage of an input signal is equal to or higher than Vg1-Vth1, a signal output from the drain of the first NMOS transistor M1 is a voltage signal of Vg1-Vth1, and the second voltage V2 is a voltage of Vg2-Vth2. In the example shown in FIG. 1, Vg1 and Vg2 are at the same potential. Hence, by making Vth2 higher than Vth1, the high-level voltage of the signal to be input to the input circuit 10 is higher than the second voltage V2 serving as the reference voltage of the operation of the input circuit 10. Hence, the operation of the input circuit 10 can be stabilized.

Figure 2:
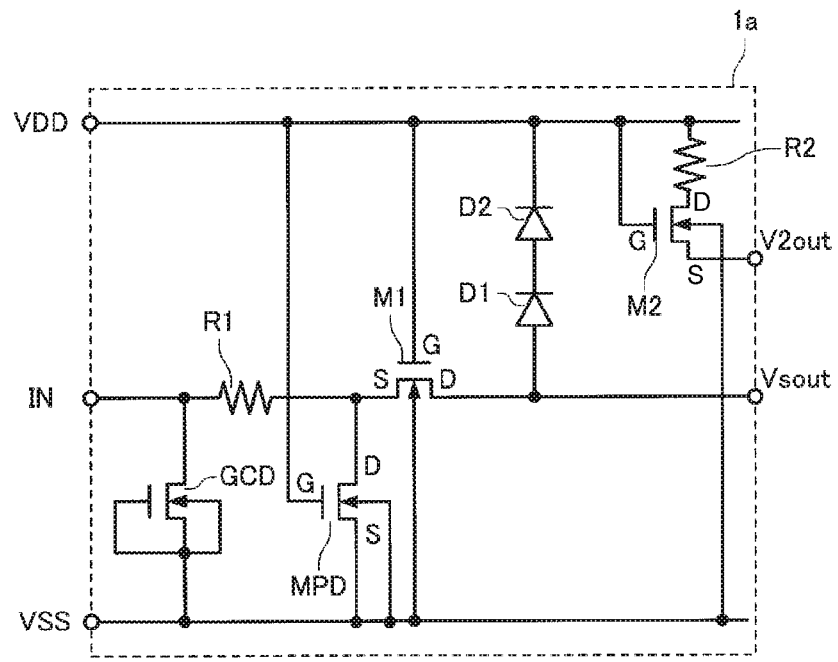
FIG. 2 is a circuit diagram showing the configuration of an input protection circuit according to a modified example.

FIG. 2 is a circuit diagram showing the configuration of an input protection circuit 1a according to a modified example. The same configurations as those of the input protection circuit 1 shown in FIG. 1 are denoted by the same reference numerals and signs, and a detailed description is omitted.

The input protection circuit 1a is configured to include, in addition to the elements constituting the input protection circuit 1, a resistor R1, a resistor R2, a gate-controlled diode GCD, and a pull-down transistor MPD.

In the example shown in FIG. 2, the source of the first NMOS transistor M1 is connected to a first terminal of the resistor R1, and the input terminal IN is connected to a second terminal of the resistor R1. Moreover, the second terminal of the resistor R1 is connected via the gate-controlled diode GCD to the ground potential terminal VSS. The resistor R1 and the gate-controlled diode GCD function as an electrostatic protection circuit for the first NMOS transistor M1.

In the example shown in FIG. 2, the source of the second NMOS transistor M2 is connected via the resistor R2 to the power supply terminal VDD. The resistor R2 functions as an electrostatic protection circuit for the second NMOS transistor M2.

In the example shown in FIG. 2, a gate of the pull-down transistor MPD is connected to the power supply terminal VDD. A drain of the pull-down transistor MPD is connected to the source of the first NMOS transistor M1. A source and a back gate of the pull-down transistor MPD are connected to the ground potential terminal VSS. The pull-down transistor MPD functions as a pull-down element for the source of the first NMOS transistor M1.

In the input protection circuit 1a shown in FIG. 2, advantageous effects similar to those of the input protection circuit 1 shown in FIG. 1 are provided for similar reasons.

In the embodiment, the inverter circuit composed of the PMOS transistor and the NMOS transistor is used as the input circuit 10 to which the input protection circuit 1 or the input protection circuit 1a is applied. However, the invention is not limited to this. It is possible to use various input circuits such as a circuit that receives an input of a clock signal from an oscillator, a circuit (input interface circuit or the like) that receives an input of a signal from a processor, and an input interface circuit of an image display device such as a liquid crystal display circuit.

2. Electronic Device

The electronic device 100 according to this embodiment will be described with reference to FIG. 1.

The electronic device 100 according to the embodiment includes the input protection circuit 1 and the input circuit 10. The input circuit 10 includes the PMOS transistor P1. The signal output from the drain of the first NMOS transistor M1 is input to the gate of the PMOS transistor P1, and the second voltage V2 output from the source of the second NMOS transistor M2 is input to the drain of the PMOS transistor P1.

According to the electronic device 100 according to the embodiment, since the second voltage V2 is less than the voltage based on the first voltage V1, the switching operation of the PMOS transistor P1 can be stabilized compared to the case where the voltage based on the first voltage V1 is input to the source of the PMOS transistor P1.

In an electronic device configured to include the input protection circuit 1a instead of the input protection circuit 1, a similar advantageous effect is provided for a similar reason.

Figure 3:
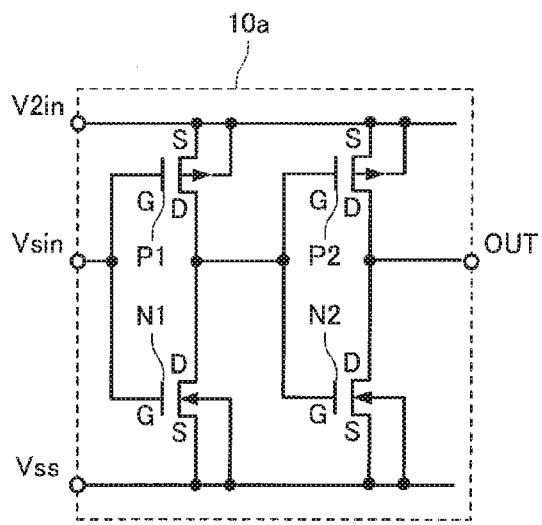
FIG. 3 is a circuit diagram showing the configuration of an input circuit according to a first modified example.

FIG. 3 is a circuit diagram showing the configuration of an input circuit 10a according to a first modified example. The same configurations as those of the input circuit 10 shown in FIG. 1 are denoted by the same reference numerals and signs, and a detailed description is omitted.

The input circuit 10a is composed of two inverter circuits, an inverter circuit configured to include the PMOS transistor P1 and the NMOS transistor N1 and an inverter circuit configured to include a PMOS transistor P2 and an NMOS transistor N2. More specifically, the drain of the PMOS transistor P1 and the drain of the NMOS transistor N1 are connected to a gate of the PMOS transistor P2 and a gate of the NMOS transistor N2. A drain of the PMOS transistor P2 and a drain of the NMOS transistor N2 are connected to the output terminal OUT. A source and a back gate of the PMOS transistor P2 are connected to the second voltage input terminal V2in. A source and a back gate of the NMOS transistor N2 are connected to the ground potential terminal Vss.

Figure 4:
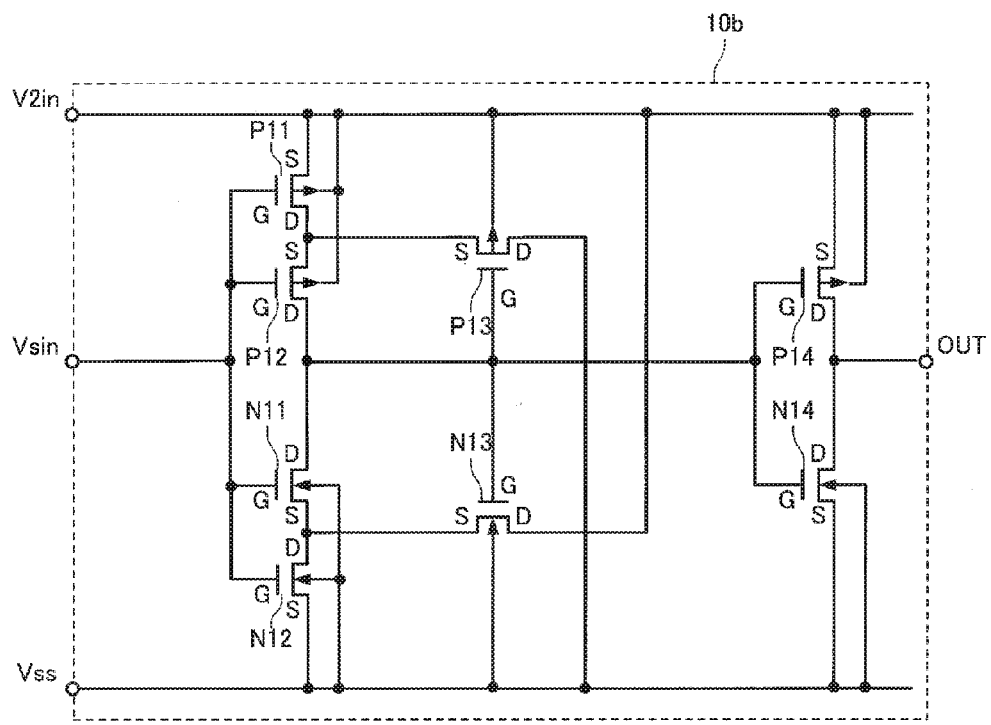
FIG. 4 is a circuit diagram showing the configuration of an input circuit according to a second modified example.

FIG. 4 is a circuit diagram showing the configuration of an input circuit 10b according to a second modified example.

The input circuit 10b is composed of a Schmitt trigger circuit. More specifically, a gate of a PMOS transistor P11, a gate of a PMOS transistor P12, a gate of an NMOS transistor N11, and a gate of an NMOS transistor N12 are connected to the signal input terminal Vsin. A source and a back gate of the PMOS transistor P11, and a back gate of the PMOS transistor P12 are connected to the second voltage input terminal V2in. A back gate of the NMOS transistor N11, and a source and a back gate of the NMOS transistor N12 are connected to the ground potential terminal Vss. A drain of the PMOS transistor P11 and a source of the PMOS transistor P12 are connected to a source of a PMOS transistor P13. A source of the NMOS transistor N11 and a drain of the NMOS transistor N12 are connected to a source of an NMOS transistor N13. A drain of the PMOS transistor P12 and a drain of the NMOS transistor N11 are connected to a gate of the PMOS transistor P13, a gate of the NMOS transistor N13, a gate of a PMOS transistor P14, and a gate of an NMOS transistor N14. A drain of the PMOS transistor P13 is connected to the ground potential terminal Vss. A back gate of the PMOS transistor P13 is connected to the second voltage input terminal V2in. A drain of the NMOS transistor N13 is connected to the second voltage input terminal V2in. A back gate of the NMOS transistor N13 is connected to the ground potential terminal Vss. A source and a back gate of the PMOS transistor P14 are connected to the second voltage input terminal V2in. A source and a back gate of the NMOS transistor N14 are connected to the ground potential terminal Vss. A drain of the PMOS transistor P14 and a drain of the NMOS transistor N14 are connected to the output terminal OUT.

When the input circuit 10a or the input circuit 10b is used instead of the input circuit 10, a similar advantageous effect is provided for a similar reason.

The input circuit 10, the input circuit 10a, and the input circuit 10b can be applied to an input unit of various circuits such as a circuit that receives an input of a clock signal from an oscillator, a circuit that receives a signal from a processor, and an input interface circuit of an image display device such as a liquid crystal display circuit.

3. Electronic Apparatus

An electronic apparatus according to this embodiment is an electronic apparatus including the input protection circuit described in the section of "1. Input Protection Circuit" or the electronic device described in the section of "2. Electronic Device".

Figure 5:
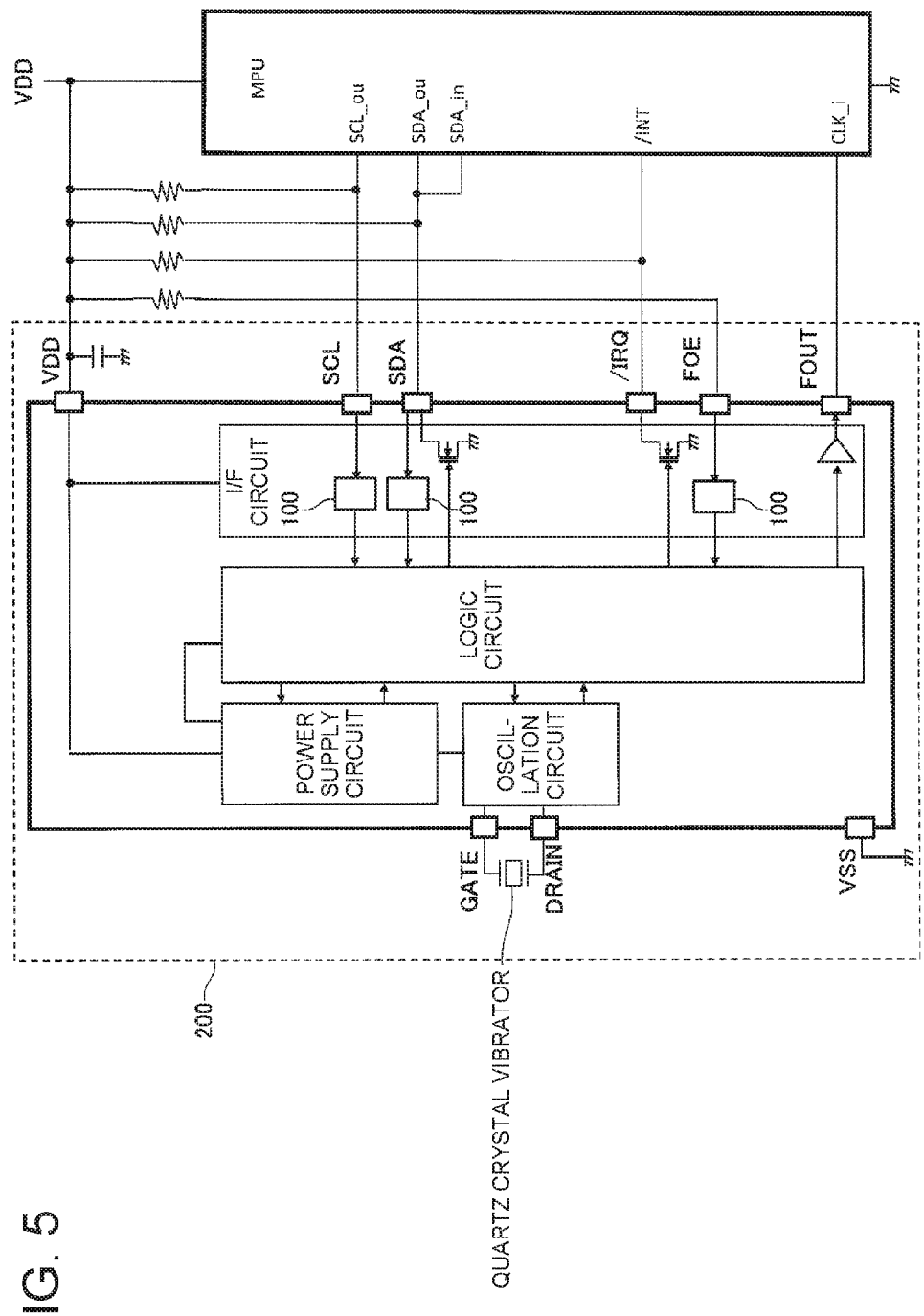
FIG. 5 is a block diagram showing the configuration of a real-time clock module as an example of an electronic apparatus according to an embodiment.

FIG. 5 is a block diagram showing the configuration of a real-time clock module 200 as an example of the electronic apparatus according to the embodiment.

In the example shown in FIG. 5, the real-time clock module 200 is configured to include a quartz crystal vibrator, an oscillation circuit, a power supply circuit, a logic circuit, and an interface circuit (I/F circuit). The interface circuit is configured to include the electronic devices 100. The interface circuit receives inputs of a clock signal and a data signal from an MPU (Micro-Processing Unit). The clock signal and the data signal received by the interface circuit are output via the electronic devices 100 to the logic circuit. The logic circuit controls the power supply circuit and the oscillation circuit. The power supply circuit supplies power to at least the oscillation circuit. The oscillation circuit and the quartz crystal vibrator oscillate at a given frequency to output an oscillation signal to the logic circuit. The logic circuit generates a clock signal based on the oscillation signal input from the oscillation circuit, and outputs the clock signal to the MPU via the interface circuit.

Figure 6:
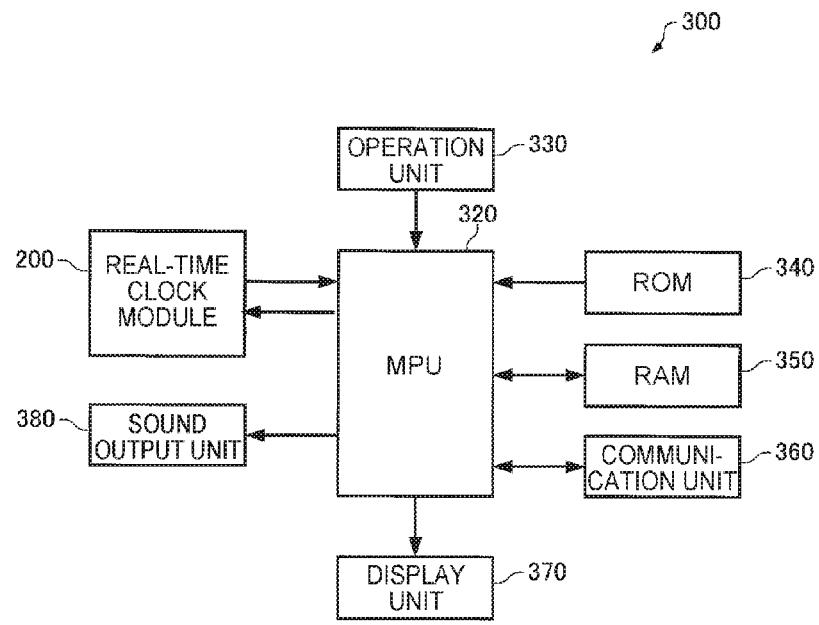
FIG. 6 is a functional block diagram of an electronic apparatus according to the embodiment.

FIG. 6 is a functional block diagram of an electronic apparatus 300 according to the embodiment. Configurations similar to those of the embodiments are denoted by the same reference numerals and signs, and a detailed description is omitted.

The electronic apparatus 300 according to the embodiment is the electronic apparatus 300 including the real-time clock module 200. In the example shown in FIG. 6, the electronic apparatus 300 is configured to include the real-time clock module 200, an MPU 320, an operation unit 330, a ROM (Read Only Memory) 340, a RAM (Random Access Memory) 350, a communication unit 360, a display unit 370, and a sound output unit 380. In the electronic apparatus 300 according to the embodiment, a portion of the constituent elements (parts) shown in FIG. 6 may be omitted or changed, or a configuration to which another constituent element is added may be employed.

The real-time clock module 200 supplies a clock signal not only to the MPU 320 but to the parts (illustration is omitted).

The MPU 320 performs, according to programs stored in the ROM 340 or the like, various kinds of computing processing or control processing using the clock signal output by the real-time clock module 200. Specifically, the MPU 320 performs various kinds of processing according to an operation signal from the operation unit 330, processing for controlling the communication unit 360 for performing data communication with the outside, processing for transmitting a display signal for causing the display unit 370 to display various kinds of information, processing for causing the sound output unit 380 to output various kinds of sounds, and the like.

The operation unit 330 is an input device composed of an operating key, a button switch, and the like, and outputs an operation signal according to a user's operation to the MPU 320.

The ROM 340 stores programs, data, and the like for the MPU 320 to perform various kinds of computing processing or control processing.

The RAM 350 is used as a working area of the MPU 320, and temporarily stores programs or data read from the ROM 340, data input from the operation unit 330, the results of operations executed by the MPU 320 according to various kinds of programs, and the like.

The communication unit 360 performs various kinds of controls for establishing data communication between the MPU 320 and an external device.

The display unit 370 is a display device composed of an LCD (Liquid Crystal Display), an electrophoretic display, or the like, and displays various kinds of information based on the display signal input from the MPU 320.

The sound output unit 380 is a device that outputs sounds, such as a speaker.

In the electronic apparatus 300 according to the embodiment, the real-time clock module 200 is taken as an example of an electronic device using the input protection circuit 1 or the input protection circuit 1a. In the embodiment, however, the input protection circuit 1 or the input protection circuit 1a can be applied also to a signal input unit between the MPU 320 and each of the parts (for example, between the MPU 320 and the ROM 340, between the MPU 320 and the RAM 350, between the MPU 320 and the communication unit 360, and between the MPU 320 and the display unit 370).

According to the electronic apparatus 300 according to the embodiment, since the input protection circuit or the electronic device that can protect the input circuit and stabilize the operation of the input circuit is included, it is possible to realize the electronic apparatus 300 with high operational reliability.

As the electronic apparatus 300, various electronic apparatuses are considered. For example, examples thereof include personal computers (for example, mobile personal computers, laptop personal computers, or tablet personal computers), mobile terminals such as mobile phones, digital still cameras, inkjet ejection apparatuses (for example, inkjet printers), storage area network apparatuses such as routers or switches, local area network apparatuses, television sets, video camcorders, video recorders, car navigation systems, pagers, electronic notebooks (including those with communication function), electronic dictionaries, calculators, electronic gaming machines, game controllers, word processors, workstations, videophones, surveillance TV monitors, electronic binoculars, POS (point of sale) terminals, medical devices (for example, electronic thermometers, sphygmomanometers, blood glucose meters, electrocardiogram measuring systems, ultrasonic diagnosis apparatuses, and electronic endoscopes), fishfinders, various kinds of measuring instrument, indicators (for example, indicators used in vehicles, aircraft, and ships), flight simulators, head-mounted displays, motion tracing, motion tracking, motion controllers, and PDR (pedestrian dead reckoning).

Figure 7:
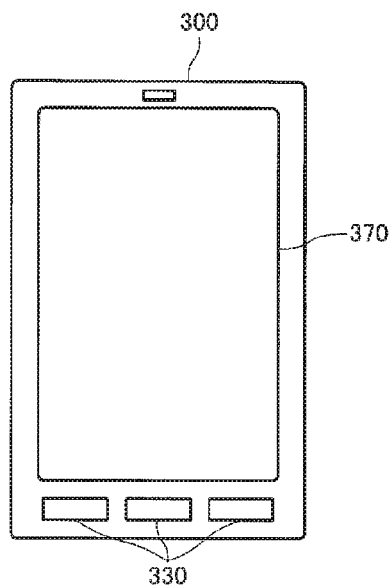
FIG. 7 is a diagram showing an example of the appearance of a smartphone as an example of the electronic apparatus.

FIG. 7 is a diagram showing an example of the appearance of a smartphone as an example of the electronic apparatus 300. The smartphone as the electronic apparatus 300 includes buttons as the operation units 330 and an LCD as the display unit 370. The smartphone as the electronic apparatus 300 can realize, with the use of the real-time clock module 200, the electronic apparatus 300 with high operational reliability.

4. Moving Object

A moving object 400 according to this embodiment is the moving object 400 including the input protection circuit described in the section of "1. Input Protection Circuit" or the electronic device described in the section of "2. Electronic Device".

Figure 8:
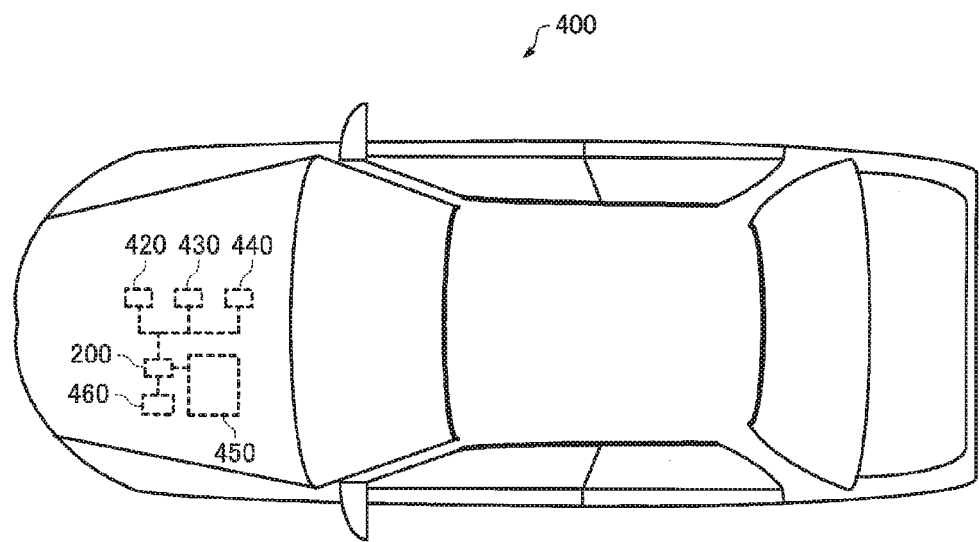
FIG. 8 is a diagram (top view) showing an example of a moving object according to an embodiment.

FIG. 8 is a diagram (top view) showing an example of the moving object 400 according to the embodiment. Configurations similar to those of the embodiments are denoted by the same reference numerals and signs, and a detailed description is omitted.

The moving object 400 according to the embodiment is the moving object 400 including the real-time clock module 200. In the example shown in FIG. 8, the moving object 400 is configured to include a controller 420, a controller 430, and a controller 440 that perform various kinds of controls for an engine system, a brake system, a keyless entry system, and the like, a battery 450, and a backup battery 460. In the moving object 400 according to the embodiment, a portion of the constituent elements (parts) shown in FIG. 8 may be omitted or changed, or a configuration to which another constituent element is added may be employed.

According to the moving object 400 according to the embodiment, since the input protection circuit or the electronic device that can protect the input circuit and stabilize the operation of the input circuit is included, it is possible to realize the moving object 400 with high operational reliability.

As the moving object 400, various moving objects are considered. For example, examples thereof include automobiles (including electric automobiles), aircraft such as jets or helicopters, ships, rockets, and artificial satellites.

Certain embodiments and modified examples have been described so far. However, the invention is not limited to the embodiments or modified examples, and can be implemented in various forms within a range not departing from the gist of the invention.

The invention includes a configuration (for example, a configuration having the same function, method, and result, or a configuration having the same advantage and advantageous effect) that is substantially the same as those described in the embodiments. Moreover, the invention includes a configuration in which a non-essential portion of the configurations described in the embodiments is replaced. Moreover, the invention includes a configuration providing the same operational effects as those described in the embodiments, or a configuration capable of achieving the same advantages. Moreover, the invention includes a configuration in which a publicly known technique is added to the configurations described in the embodiments.

The entire disclosure of Japanese Patent Application No. 2013-164905 filed Aug. 8, 2013 is expressly incorporated by reference herein.

What is claimed is:

1. An input protection circuit that changes a signal voltage of a first signal to be input to an input circuit to a predetermined voltage or less and outputs the signal, the input protection circuit comprising:
    a first NMOS transistor including:
        a source to which a second signal is input,
        a gate to which a voltage is applied, the voltage being based on a first voltage, and
        a drain that outputs the first signal to the input circuit, the first signal being based on the second signal input to the source and the voltage input to the gate;
    a second NMOS transistor including:
        a drain to which the voltage based on the first voltage is applied,
        a gate to which the voltage based on the first voltage is applied, and
        a source that outputs a second voltage to the input circuit based on the voltage applied to the drain and the gate;
    a power supply terminal to which the first voltage is applied; and
    a diode connected between the drain of the first NMOS transistor and the power supply terminal, wherein a cathode of the diode is connected to the power supply terminal, and an anode of the diode is connected to the drain of the first NMOS transistor.

2. The input protection circuit according to claim 1, wherein
    the first NMOS transistor includes a first back gate,
    the second NMOS transistor includes a second back gate, and
    the first and second back gates are at a substrate potential.

3. The input protection circuit according to claim 1, wherein
    the first NMOS transistor and the second NMOS transistor are both depletion transistors.

4. The input protection circuit according to claim 1, wherein
    the first NMOS transistor has a first threshold voltage,
    the second NMOS transistor has a second threshold voltage, and the second threshold voltage is higher than the first threshold voltage.

5. An electronic device comprising:
the input protection circuit according to claim 1; and
the input circuit,
wherein the input circuit includes a PMOS transistor,
the first signal output from the drain of the first NMOS transistor is input to a gate of the PMOS transistor, and
the second voltage output from the source of the second NMOS transistor is input to a source of the PMOS transistor.

6. An input protection circuit that changes a signal voltage of a first signal to be input to an input circuit to a predetermined voltage or less and outputs the signal, the input protection circuit comprising:
a first NMOS transistor including:
a source receiving a second signal,
a gate receiving a first voltage,
a drain outputting the first signal to the input circuit, the first signal corresponding to the second signal and the first voltage, and
a first back gate at a substrate potential;
a second NMOS transistor including:
a drain receiving the first voltage,
a gate receiving the first voltage,
a source outputting a second voltage to the input circuit, the second voltage corresponding to the first voltage, and
a second back gate at the substrate potential;
a power supply terminal to which a power supply voltage is applied, wherein the first voltage is based on the power supply voltage; and
a diode connected between the drain of the first NMOS transistor and the power supply terminal, wherein a cathode of the diode is connected to the power supply terminal, and an anode of the diode is connected to the drain of the first NMOS transistor.

7. The input protection circuit according to claim 6, wherein
the first NMOS transistor and the second NMOS transistor are both depletion transistors.

8. The input protection circuit according to claim 6, wherein
the first NMOS transistor has a first threshold voltage, the second NMOS transistor has a second threshold voltage, and
the second threshold voltage is higher than the first threshold voltage.

* * * * *